(12) United States Patent
Maeda et al.

(10) Patent No.: US 12,142,393 B2
(45) Date of Patent: Nov. 12, 2024

(54) INSULATION SHEET

(71) Applicant: TEIJIN LIMITED, Osaka (JP)

(72) Inventors: Masanori Maeda, Osaka (JP);
Yoshinori Ikeda, Osaka (JP);
Masayuki Chokai, Osaka (JP); Takuya Murakami, Osaka (JP)

(73) Assignee: TEIJIN LIMITED, Osaka (JP)

( * ) Notice: Subject to any disclaimer, the term of this patent is extended or adjusted under 35 U.S.C. 154(b) by 392 days.

(21) Appl. No.: 17/440,893

(22) PCT Filed: Dec. 26, 2019

(86) PCT No.: PCT/JP2019/051286
§ 371 (c)(1),
(2) Date: Sep. 20, 2021

(87) PCT Pub. No.: WO2020/194972
PCT Pub. Date: Oct. 1, 2020

(65) Prior Publication Data
US 2022/0165457 A1 May 26, 2022

(30) Foreign Application Priority Data
Mar. 22, 2019 (JP) ................. 2019-054540
Sep. 3, 2019 (JP) ................. 2019-160540

(51) Int. Cl.
*H01B 17/60* (2006.01)
*C04B 35/583* (2006.01)
(Continued)

(52) U.S. Cl.
CPC .......... *H01B 17/60* (2013.01); *C04B 35/583* (2013.01); *C04B 35/63468* (2013.01);
(Continued)

(58) Field of Classification Search
None
See application file for complete search history.

(56) References Cited

U.S. PATENT DOCUMENTS

2011/0223427 A1 9/2011 Wano et al.
2012/0188730 A1 7/2012 Miyata et al.
(Continued)

FOREIGN PATENT DOCUMENTS

CN 101899209 A 12/2010
CN 106575644 A 4/2017
(Continued)

OTHER PUBLICATIONS

International Search Report of PCT/JP2019/051286 dated Mar. 24, 2020 [PCT/ISA/210].

*Primary Examiner* — Chinessa T. Golden
(74) *Attorney, Agent, or Firm* — Sughrue Mion, PLLC

(57) ABSTRACT

An object of the present invention is to provide an insulation sheet having high thermal conductivity in the in-plane direction. The present invention provides an insulation sheet comprising insulating particles and a binder resin, wherein, for the entire cross-section of the sheet perpendicular to the in-plane direction, the insulation sheet contains 75 to 97% by area of the insulating particles, 3 to 25% by area of the binder resin, and 10% by area or less of the voids.

14 Claims, 5 Drawing Sheets

(51) Int. Cl.
*C04B 35/634* (2006.01)
*H01B 3/12* (2006.01)
*H01B 19/00* (2006.01)

(52) U.S. Cl.
CPC ............... *H01B 3/12* (2013.01); *H01B 19/00* (2013.01); *C04B 2235/60* (2013.01); *C04B 2235/9607* (2013.01)

(56) References Cited

U.S. PATENT DOCUMENTS

| | | | |
|---|---|---|---|
| 2014/0008566 A1 | 1/2014 | Kitagawa et al. | |
| 2014/0291607 A1* | 10/2014 | Kim | H01L 29/778 |
| | | | 428/141 |
| 2015/0090922 A1 | 4/2015 | Hatakeyama et al. | |
| 2015/0295216 A1* | 10/2015 | Okuno | H02J 7/0068 |
| | | | 320/128 |
| 2017/0117208 A1* | 4/2017 | Kasztelan | H01L 23/49562 |
| 2017/0253783 A1 | 9/2017 | Naito et al. | |
| 2017/0309542 A1 | 10/2017 | Aramaki et al. | |
| 2018/0068758 A1* | 3/2018 | Jendenmalm | B32B 5/16 |
| 2018/0230352 A1 | 8/2018 | Takeda | |
| 2019/0077133 A1 | 3/2019 | Sawaguchi et al. | |
| 2020/0247963 A1 | 8/2020 | Ito et al. | |

FOREIGN PATENT DOCUMENTS

| | | |
|---|---|---|
| CN | 108780783 A | 11/2018 |
| EP | 2 626 205 A1 | 8/2013 |
| EP | 3 015 487 A1 | 5/2016 |
| JP | 2010-137562 A | 6/2010 |
| JP | 2011-090868 A | 5/2011 |
| JP | 2011-100757 A | 5/2011 |
| JP | 2011-124077 A | 6/2011 |
| JP | 2012-064691 A | 3/2012 |
| JP | 2012-212727 A | 11/2012 |
| JP | 2013-053180 A | 3/2013 |
| JP | 2015-193504 A | 11/2015 |
| JP | 2016-092407 A | 5/2016 |
| KR | 10-2014-0127810 A | 11/2014 |
| WO | 2014/208694 A1 | 12/2014 |
| WO | 2017/213248 A1 | 12/2017 |
| WO | 2018/123012 A1 | 7/2018 |

* cited by examiner

INSULATION SHEET

CROSS REFERENCE TO RELATED APPLICATIONS

This application is a National Stage of International Application No. PCT/JP2019/051286, filed Dec. 26, 2019, claiming priority to Japanese Patent Application No. 2019-054540, filed Mar. 22, 2019, and Japanese Patent Application No. 2019-160540, filed Sep. 3, 2019.

FIELD

The present disclosure relates to an insulation sheet having excellent thermal conductivity and heat transport properties in an in-plane direction, which can quickly diffuse heat from a heat generating component such as a semiconductor element, a power supply, and a light source inside an electric product, thereby mitigating a local temperature rise or transporting heat away from the heat generating source.

In recent years, the importance of heat radiation countermeasures has been increasing due to the increase in heat generation density of an electronic equipment which becomes thinner and smaller and has higher output. To reduce the heat-related trouble of the electronic device, it is important to rapidly release and diffuse the heat generated in the device to a coolant, a housing or the like, so as not to adversely affect surrounding members. For this purpose, a thermal conductive member capable of heat conduction in a specific direction is required. Also, in many cases, for the purpose of preventing an electrical leakage to the coolant or housing, the thermal conductive member is also required to have electrical insulation properties.

As a technique for increasing the thermal conductivity of a resin material having insulating properties and flexibility, a composite of an inorganic filler, particularly boron nitride, and a resin material has been proposed. For example, in Patent Document 1, the thermal conductivity in the in-plane direction of 24 W/(m·K) is achieved by containing 85% by volume of boron nitride in a thermoplastic elastomer and a liquid paraffin. In Patent Document 2, the thermal conductivity in the in-plane direction of 35 W/(m·K) is achieved by mixing 80% by volume of boron nitride in a fluororesin. In Patent Document 3, the thermal conductivity in the in-plane direction of 42W/(m·K) is achieved by mixing 83% by volume of boron nitride with an epoxy resin having a naphthalene structure and by thermally curing the mixture.

RELATED ART

Patent Literature

[Patent Document 1] JP-A-2012-64691
[Patent Document 2] JP-A-2010-137562
[Patent Document 3] JP-A-2011-90868

SUMMARY

Problems to be Solved by the Invention

In the conventional insulation sheet, there is a case where it is not possible to obtain sufficiently high thermal conductivity in the in-plane direction.

In such a background, an object of the present disclosure is to provide an insulation sheet having high thermal conductivity in the in-plane direction.

Solution to the Problem

The inventors have found that the above problem is solved by the following embodiments:

Embodiment 1

An insulation sheet comprising insulating particles and a binder resin, wherein, for the entire cross-section of the sheet perpendicular to the in-plane direction, based on 100% by area of the total of the insulating particles, the binder resin and voids, the insulation sheet contains 75 to 97% by area of the insulating particles, 3 to 25% by area of the binder resin, and 10% by area or less of the voids.

Embodiment 2

The insulation sheet according to embodiment 1, wherein the insulating particles comprise flat-shaped particles that are deformed.

Embodiment 3

The insulation sheet according to embodiment 2, wherein the insulating particles include 50% by volume or more of boron nitride.

Embodiment 4

The insulation sheet according to any one of embodiments 1 to 3, wherein a melting point or a thermal decomposition temperature of the binder resin is 150° C. or higher.

Embodiment 5

The insulation sheet according to any one of embodiments 1 to 4, wherein the binder resin is an aramid resin.

Embodiment 6

The insulation sheet according to any one of embodiments 1 to 5, which comprises a skin layer containing a binder resin and no insulating particles.

Embodiment 7

The insulation sheet according to any one of embodiments 1 to 6, having the surface roughness Ra of 0.5 µm or less.

Embodiment 8

The insulation sheet according to any one of embodiments 1 to 7, wherein the salt concentration is 900 ppm or less.

Embodiment 9

The insulation sheet according to any one of embodiments 1 to 8, wherein the residual solvent concentration is 3% by weight or less.

Embodiment 10

The insulation sheet according to any one of embodiments 1 to 9, having the thermal conductivity in the in-plane direction of 30 W/(m·K) or more, and the dielectric breakdown voltage of 5 kV/mm or more.

Embodiment 11

The insulation sheet according to any one of embodiments 1 to 10, having relative permittivity at 1 GHz of 6 or less.

Embodiment 12

A method for manufacturing the insulation sheet according to any one of embodiments 1 to 11, comprising:
mixing insulating particles, a binder resin, and a solvent to obtain a slurry,
shaping the slurry after the mixing into a sheet and drying the shaped slurry to form an insulation sheet precursor, and
subjecting the insulation sheet precursor to a roll press treatment.

Embodiment 13

The method according to embodiment 12, wherein the insulating particles comprise flat-shaped particles.

Embodiment 14

The method according to embodiment 13, wherein the insulating particles comprise 50% by volume or more of boron nitride.

Embodiment 15

The method according to any one of embodiments 12 to 14, wherein the slurry comprises 75 to 97 parts by volume of the insulating particles and 3 to 25 parts by volume of the binder resin, based on 100 parts by volume of the total of the insulating particles and the binder resin.

Advantageous Effects of Invention

According to the present invention, it is possible to provide an insulation sheet having high thermal conductivity in the in-plane direction.

DESCRIPTION OF EMBODIMENTS

Embodiments of the present invention will be described below.

<<Insulation Sheet>>

The insulation sheet of the present disclosure comprises insulating particles and a binder resin,
wherein, for the entire cross-section perpendicular to the in-plane direction, based on 100% by area of the total of the insulating particles, the binder resin and voids, the insulation sheet contains:
75 to 97% by area of the insulating particles,
3 to 25% by area of the binder resin, and
10% by area or less of the voids.

The insulation sheet of the present disclosure has relatively high packing ratio (relatively high packing density) of the insulating particles and relatively high thermal conductivity in the in-plane direction.

Figure 1:
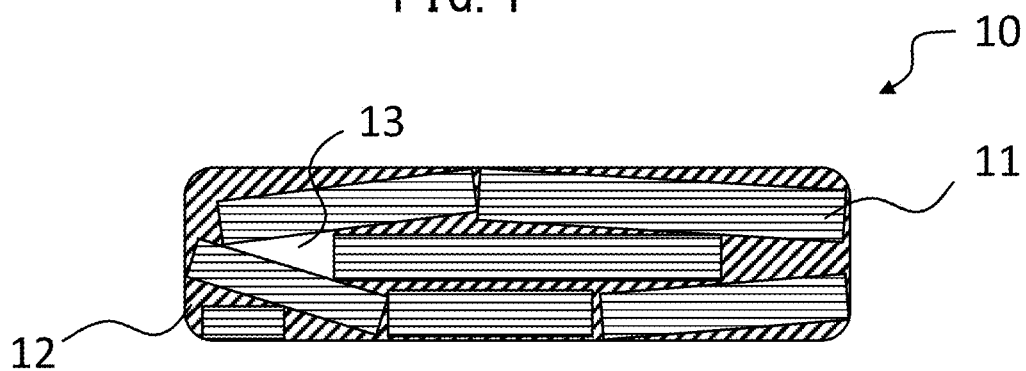
FIG. 1 shows a schematic cross-sectional view of the insulation sheet according to an embodiment of the present disclosure.

FIG. 1 shows a schematic diagram of a cross-section perpendicular to the in-plane direction of one embodiment of the insulation sheet according to the present disclosure. In the insulation sheet 10 according to the present disclosure, packing ratio of the insulating particles 11 is relatively high because the content of the binder resin 12 is reduced. It is considered that in the insulation sheet 10, due to the high packing ratio of the insulating particles 11, the distance between the particles is relatively small, resulting in high thermal conductivity in the in-plane direction. Further, at the same time, it is considered that, due to the reduced content of the binder resin 12, the thermal resistance caused by the resin is suppressed.

Further, in the insulation sheet 10 according to the present disclosure of FIG. 1, in addition to the content of the binder resin 12 being reduced, voids 13 in the sheet are also relatively reduced. It is considered that, in such an insulation sheet, the packing ratio of the insulating particles 11 is further increased, and as a result, the effect of increasing the thermal conductivity in the in-plane direction is further enhanced.

The insulation sheet according to the present disclosure can be obtained, for example, by subjecting an insulation sheet precursor containing insulating particles and a binder resin to a roll press treatment. An insulation sheet precursor formed into a sheet contains a large amount of bubbles. It is considered that, by compressing the precursor using a roll press method in this state, the insulating particles inside the sheet can be oriented along the in-plane direction of the sheet and the bubbles inside the insulation sheet precursor can be reduced, and as a result, the thermal conductivity in the in-plane direction of the resulting insulation sheet is increased.

Figure 3:
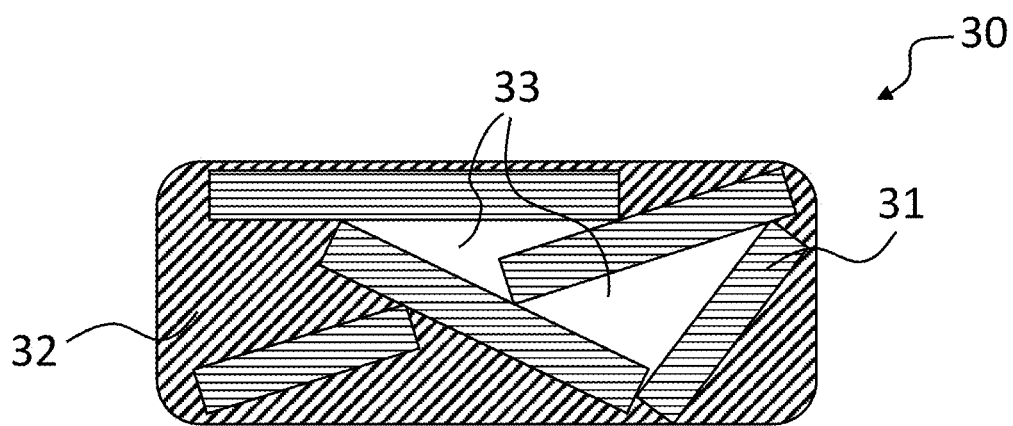
FIG. 3 shows a schematic cross-sectional view of the insulation sheet according to prior art.
Figure 4:
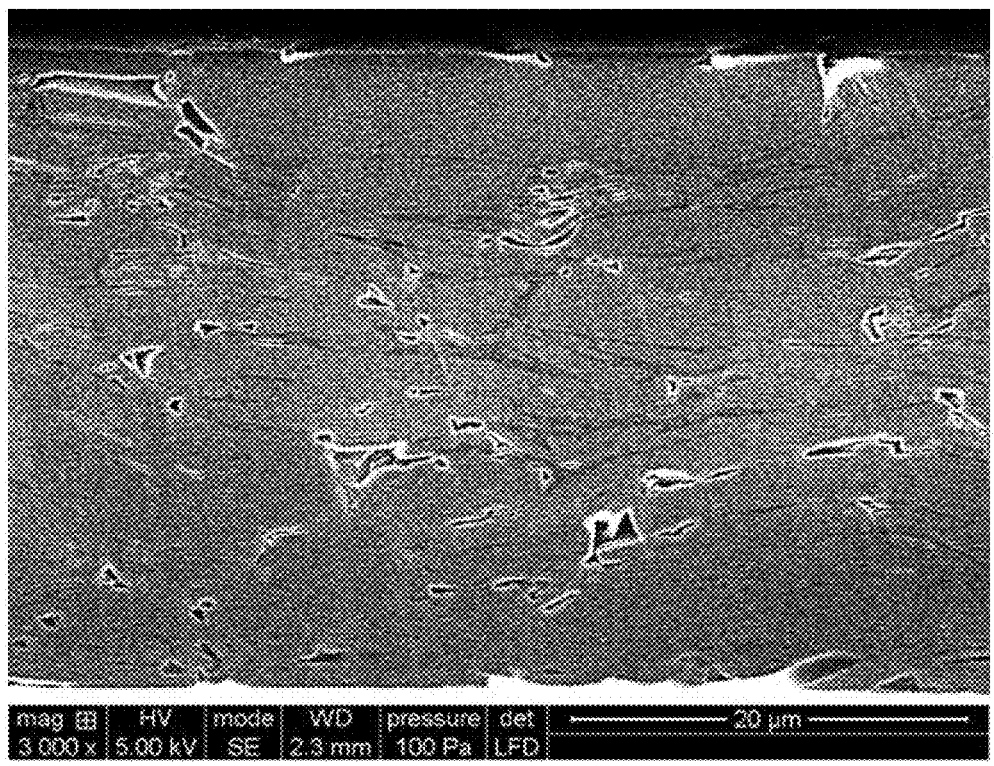
FIG. 4 shows a SEM photograph of a cross-section perpendicular to the in-plane direction of the insulation sheet according to Example 1.
Figure 5:
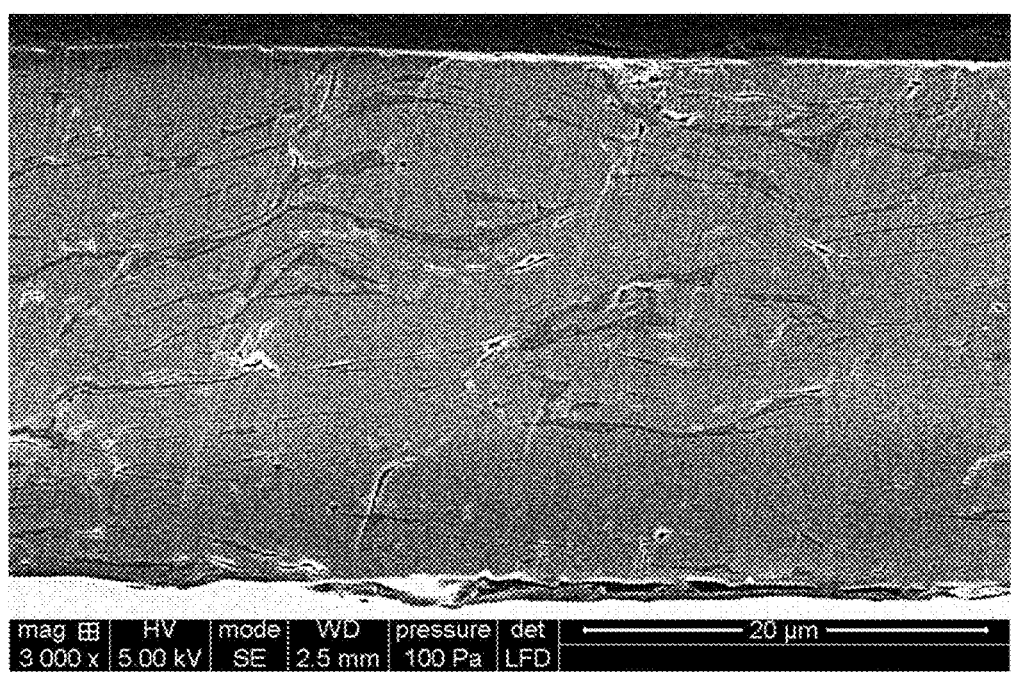
FIG. 5 shows a SEM photograph of a cross-section perpendicular to the in-plane direction of the insulation sheet according to Example 2.
Figure 6:
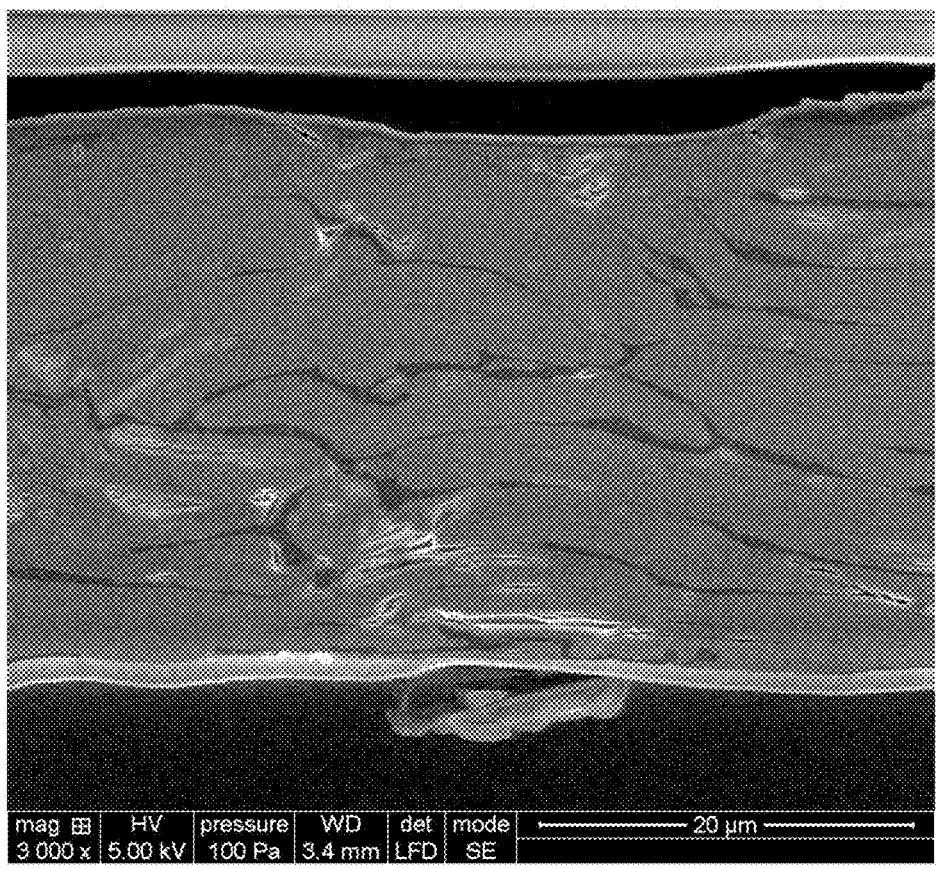
FIG. 6 shows a SEM photograph of a cross-section perpendicular to the in-plane direction of the insulation sheet according to Example 3.
Figure 7:
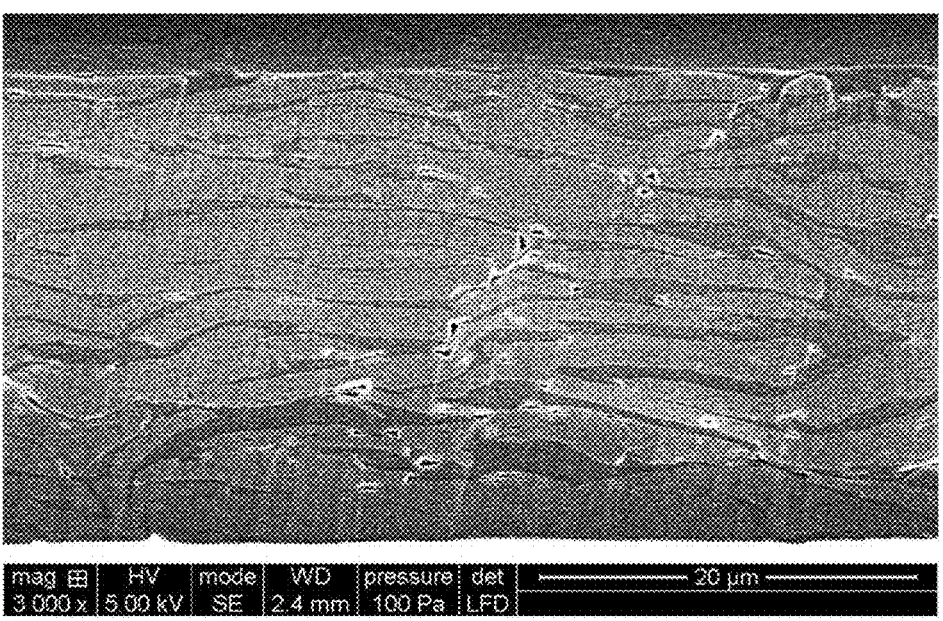
FIG. 7 shows a SEM photograph of a cross-section perpendicular to the in-plane direction of the insulation sheet according to Example 4.
Figure 8:
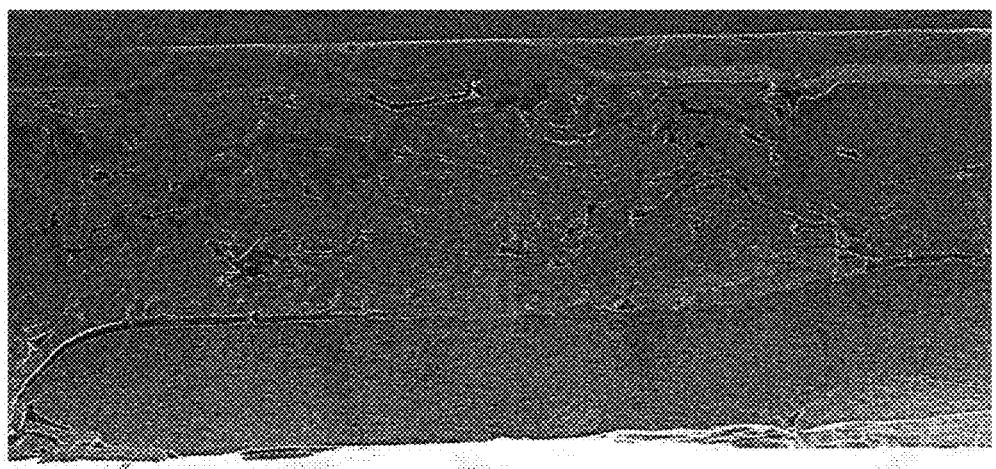
FIG. 8 shows a SEM photograph of a cross-section perpendicular to the in-plane direction of the insulation sheet according to Example 5.

FIG. 3 shows a schematic view of a cross-section perpendicular to the in-plane direction of the insulation sheet 30 according to the prior art. In the insulation sheet 30, since the percentage of a binder resin 32 is relatively high and voids 33 between particles are relatively large, packing ratio of insulating particles 31 is relatively low. It is considered that, in such an insulation sheet, since the distance between the insulating particles 31 is large, high thermal conductivity in the in-plane direction cannot be obtained.

Hereinafter, each element constituting the insulation sheet of the present disclosure will be described in more detail.

<Insulating Particle>

The insulation sheet according to the present disclosure contains insulating particles.

With respect to the entire cross-section perpendicular to the in-plane direction of the sheet, the insulation sheet according to the present disclosure contains 75% to 97% by area of insulating particles, based on 100% by area of the total of the insulating particles, the binder resin, and the voids. When the content of the insulating particles are 75% by area or more, good thermal conductivity is obtained, and when the content of the insulating particles is 97% by area or less, increase in viscosity of resin composition is suppressed, thereby ease of molding is ensured.

Preferably, with respect to the entire cross-section perpendicular to the in-plane direction of the sheet, the insulating particles contained in the insulation sheet according to the present disclosure may be 80% by area or more, 85% by area or more, or 90% by area or more, and/or 96% by area or less, 95% by area or less, 94% by area or less, 93% by area or less, 92% by area or less, or 91% by area or less, based on 100% by area of the total of the insulating particles, the binder resin, and the voids.

In the present disclosure, for the entire cross-section perpendicular to the in-plane direction of the sheet, the "% by area" of the insulating particles based on 100% by area of the total of the insulating particles, the binder resin, and the voids can be calculated by taking an image of a cross-section perpendicular to the in-plane direction of the insulation sheet by a scanning electron microscope (SEM) and measuring the total area of the insulating particles present in an area in the acquired image. Incidentally, in the case where the insulation sheet has additives other than the insulating particles and the binder resin, the "% by area" of the insulating particles based on 100% by area of the total of the insulating particles, the binder resin, and the voids can be calculated for example by setting the above-mentioned area so that the additive is not included in the above-mentioned area.

The insulating particles are not particularly limited and include, for example, boron nitride, aluminum nitride, aluminum oxide, magnesium oxide, silicon nitride, silicon carbide, metal silicon particles whose surfaces are insulated, carbon fiber and graphite whose surfaces are coated with an insulating material such as a resin, and polymer fillers. From the viewpoint of thermal conductivity in the in-plane direction and insulation properties, the insulating particles are preferably boron nitride, and in particular hexagonal boron nitride.

The average particle size of the insulating particles are preferably from 1 to 200 μm, more preferably from 5 to 200 μm, still more preferably from 5 to 100 μm, and particularly preferably from 10 to 100 μm.

Average particle size is a median diameter (a particle diameter for which, when a powder is divided into two by a certain particle diameter, the amount of the particles larger than that particle diameter becomes equal to the amount of the particles smaller than that particle diameter; also generally referred to as D50) measured by a laser diffraction method using a laser diffraction/scattering particle size distribution measurement apparatus.

(Deformation)

In one advantageous embodiment of the insulation sheet according to the present disclosure, the insulating particles comprise flat-shaped particles which are deformed.

Figure 2:
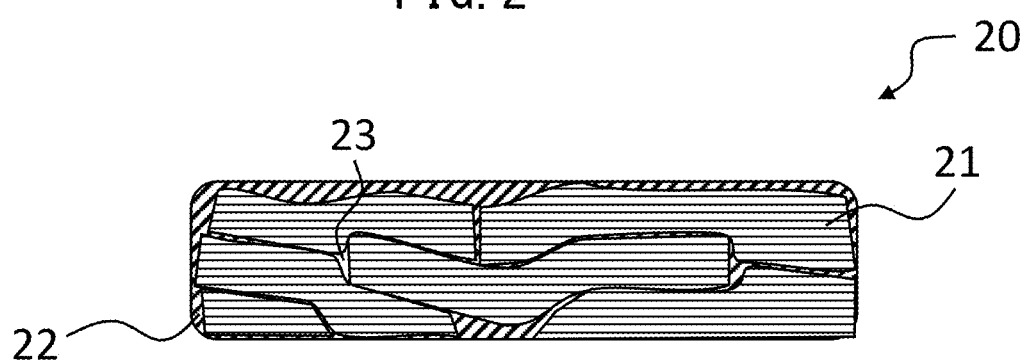
FIG. 2 shows a schematic cross-sectional view of the insulation sheet according to another embodiment of the present disclosure.

In such an insulation sheet, the thermal conductivity in the in-plane direction is further improved. Without wishing to be bound by theory, one of the reason for this may be that the deformation of the flat-shaped particles further reduces voids within the sheet. In general, it is considered that in the case of flat-shaped particles, gaps tend to occur between the particles due to three-dimensional hindrance caused by the shape of the particles. Therefore, conventionally, it has been considered that the percentage of the voids in the sheet (porosity of the sheet) increases when the content of the particles is high. On the other hand, in the insulation sheet according to an advantageous embodiment of the present disclosure, as shown in FIG. 2, the flat-shaped particles 21 are deformed, so that the gaps between the particles are filled, and as a result, the voids 23 are further reduced. It is also considered that the deformation of the flat-shaped particles 21 during the roll press treatment promotes the discharge of air bubbles trapped between the particles to the outside of the sheet and thereby further promotes the reduction of the voids 23.

A method for obtaining the insulation sheet containing the deformed flat-shaped particles is not particularly limited, but includes for example a method of subjecting an insulation sheet precursor containing insulating particles comprising flat-shaped particles to a roll press treatment. In particular, it is considered that the deformation of the particles becomes more remarkable by performing the roll press treatment in an insulation sheet precursor in which the insulating particles contain flat-shaped particles and the insulating particles are highly packed. Without wishing to be bound by theory, it is considered that in such a method, the shear stress imparted between the flat-shaped particles is relatively high, and as a result, the deformation of the flat-shaped particles is promoted. For example, in the case of the embodiment of FIG. 2, the content of the binder resin 22 is relatively low and the insulating particles are relatively densely packed. It is considered that when the sheet in such a state is subjected to a roll press treatment, since the high shear stress is imparted between the insulating particles, the insulating particles are relatively easily deformed.

Incidentally, even in the conventional insulation sheet, the insulating particles may be deformed. However, it is considered that in this case, the degree of deformation is relatively small and not enough to reduce the porosity.

(Flat-Shaped Particle)

When the insulating particles include flat-shaped particles, i.e., scaly particles or flaky particles, the flat-shaped particles preferably represent 50% by volume or more per 100% by volume of the entire insulating particles. When the content is 50% by volume or more, good thermal conductivity in the in-plane direction can be ensured. The flat-shaped particles per 100% by volume of the insulating particles are more preferably 60% by volume or more, more preferably 70% by volume or more, still more preferably 80% by volume or more, particularly preferably 90% by volume or more, and most preferably the insulating particles consist of flat-shaped particles.

The aspect ratio of the flat-shaped particle is preferably 10 to 1000. When the aspect ratio is 10 or more, an orientation, which is important for higher thermal diffusivity, is ensured, and high thermal diffusivity can be obtained, which is preferable. Further, a particle having an aspect ratio of 1000 or less is preferable from the viewpoint of ease of processing because increase in the viscosity of a composition due to increase in specific surface area is suppressed.

The aspect ratio is a value obtained by dividing the major axis (longitudinal length) of the particle by the thickness of the particle, that is, the major axis/thickness. When the particle is spherical, the aspect ratio is 1, and the aspect ratio increases as the degree of flatness increases.

The aspect ratio can be obtained by measuring the major axis and thickness of the particle at a magnification of 1500 times using a scanning electron microscope and calculating the major axis/thickness.

The average particle size of the flat-shaped particle is, for example, 1 μm or more, preferably 1 to 200 μm, more preferably 5 to 200 μm, still more preferably 5 to 100 μm, and particularly preferably 10 to 100 μm.

(Boron Nitride)

The flat-shaped particle may include, for example, hexagonal boron nitride (h-BN).

The average particle size of the boron nitride particle is, for example, 1 μm or more, preferably 1 to 200 μm, more preferably 5 to 200 μm, more preferably 5 to 100 μm, and particularly preferably 10 to 100 μm. When the average particle size is 1 μm or more, the specific surface area of boron nitride is small and compatibility with a resin is ensured, which is preferable. When the average particle size is 200 μm or less, uniformity of thickness of the sheet can be ensured at the time of sheet molding, which is preferable. Boron nitride may be a boron nitride having a single average particle diameter, or a mixture of a plurality of boron nitrides having different average particle diameters.

The aspect ratio of the boron nitride particle is preferably from 10 to 1000.

When using boron nitride as the insulating particle, an insulating particle other than the boron nitride particle may be used in combination with the boron nitride particle. Even in this case, the boron nitride particles preferably represent 50% by volume or more per 100% by volume of the entire insulating inorganic particles. If the amount is 50% by volume or more, good thermal conductivity in the in-plane direction can be ensured, which is preferable. The amount of the boron nitride particles per 100% by volume of the insulating inorganic particles is more preferably 60% by volume or more, more preferably 70% by volume or more, still more preferably 80% by volume or more, and particularly preferably 90% by volume or more.

When using boron nitride particles and ceramic particles having isotropic thermal conductivity in combination as the insulating inorganic particles, it is possible to adjust the balance of the thermal conductivity in the thickness direction and the thermal conductivity in the in-plane direction of the insulation sheet as necessary, which is preferable. Further, since the boron nitride particle is an expensive material, for example, it is convenient to use the boron nitride particles in conjunction with an inexpensive material such as metal silicon particles which are insulated by thermal oxidization of the surface. In this case, it is possible to adjust the balance of the cost of the raw material and the thermal conductivity of the insulation sheet as necessary, which is preferable.

<Binder Resin>

The insulation sheet according to the present disclosure contains a binder resin.

The insulation sheet according to the present disclosure contains, for the entire cross-section perpendicular to the in-plane direction of the sheet, 3% to 25% by area of the binder resin based on 100% by area of the total of the insulating particles, the binder resin and the voids. When the content of the binder resin is 25% by area or less, a sufficiently high thermal conductivity can be ensured, and when the content is 3% by area or more, moldability can be ensured. In addition, when the content ratio of the binder resin is 3% by area or more, it is considered that the binder resin fills the gap between the insulating particles and the like, thereby reducing the voids.

Preferably, for the entire cross-section perpendicular to the in-plane direction of the insulation sheet according to the present disclosure, the binder resin contained in the insulation sheet may be 5% area or more, more than 5% by area, 6% by area or more, 7% by area or more, or 8% by area or more, and/or 24% by area or less, 20% by area or less, 15% by area or less, 12% by area or less, or 10% by area or less, based on 100% by area of the total of the insulating particles, the binder resin, and the voids. In particular, when the content ratio of the binder resin is 5% by area or more, it is considered that a sufficient amount of the binder resin is secured to fill gaps between insulating particles and the like, and voids are further reduced.

In the present disclosure, for the entire cross-section perpendicular to the in-plane direction of the sheet, the "% by area" of the binder resin based on 100% by area of the total of the insulating particles, the binder resin, and the voids can be calculated by taking an image of the cross-section perpendicular to the in-plane direction of the insulation sheet by SEM, and measuring the area of the binder resin present in an area in the obtained image. Incidentally, in the case where the insulation sheet has additives other than the insulating particles and the binder resin, the "% by area" of the binder resin based on 100% by area of the total of the insulating particles, the binder resin, and the voids can be calculated by, for example, setting the above-mentioned area so that the additives are not included in the above-mentioned area.

The binder resin according to the present disclosure is not particularly limited. Examples of the binder resin include an aramid resin (aromatic polyamide), a polyvinylidene fluoride (PVDF) resin, a silicone resin, a polyimide resin, a polytetrafluoroethylene (PTFE) resin, a phenol resin, an epoxy resin, a liquid crystal polymer (LCP) resin, a polyarylate (PAR) resin, a polyetherimide (PEI) resin, a polyethersulfone (PES) resin, a polyamideimide (PAI) resin, a polyphenylene sulfide (PPS) resin, a polyether ether ketone (PEEK) resin, and a polybenzoxazole (PBO). The binder resin is particularly preferably an aromatic polyamide. The aromatic polyamide has excellent strength compared with an aliphatic polyamide. Therefore, when the aromatic polyamide is used as the binder resin, it is possible to provide an insulation sheet exhibiting excellent retention of the insulating particles as well as excellent stability of the sheet shape.

(Thermal Properties)

From the viewpoint of the thermal properties of the insulation sheet, it is preferable that the binder resin has excellent properties in heat resistance and/or flame retardancy. In particular, it is preferable that the melting point or the thermal decomposition temperature (decomposition temperature) of the binder resin is 150° C. or more.

The melting point of the binder resin is measured with a differential scanning calorimeter. The melting point of the binder resin is more preferably 200° C. or higher, still more preferably 250° C. or higher, and particularly preferably 300° C. or higher. The upper limit of the melting point of the binder resin is not particularly limited, but is, for example, 600° C. or less, 500° C. or less, or 400° C. or less.

The thermal decomposition temperature of the binder is measured with a differential scanning calorimeter. The thermal decomposition temperature of the binder resin is more preferably 200° C. or more, still more preferably 300° C. or more, particularly preferably 400° C. or more, and most preferably 500° C. or more. The upper limit of the thermal decomposition temperature of the binder resin is not particularly limited, but is, for example, 1000° C. or less, 900° C. or less, or 800° C. or less.

When used for heat dissipation application inside an electronic device for a vehicle, heat resistance temperature of the resin material needs to be higher. In the case of a power semiconductor using silicon carbide, heat resistance around 300° C. is required. Therefore, a resin having heat resistance of 300° C. or more can be suitably used for the in-vehicle application, especially for the heat radiation around the power semiconductor. As an example of such a resin, an aramid resin can be mentioned.

(Thermoplastic Resin)

From the viewpoint of flexibility and handling property, it is particularly preferable that the binder resin is a thermoplastic binder resin. Since the insulation sheet containing the thermoplastic resin does not require thermal curing at the time of manufacturing, it is excellent in flexibility and can be relatively easily applied to the inside of an electronic device.

In addition, when the binder resin is a thermoplastic binder resin, it is considered that voids in the insulation sheet can be further reduced, which is particularly preferable. Without wishing to be bound by theory, it is considered that in the case where a thermoplastic resin is used as the binder resin, the thermoplastic resin is softened by a heat treatment which is applied for example during the roll press treatment at the time of manufacturing the insulation sheet, the discharge of bubbles trapped between the insulating particles is further promoted, and as a result, the effect of reducing voids can be further enhanced.

The thermoplastic resin which can be used as the binder resin according to the present disclosure include an aramid resin, a polyvinylidene fluoride (PVDF) resin, a thermoplastic polyimide resin, a polytetrafluoroethylene (PTFE) resin, a liquid crystal polymer (LCP) resin, a polyarylate (PAR) resin, a polyetherimide (PEI) resin, a polyethersulfone (PES) resin, a polyamideimide (PAI) resin, a polyphenylene sulfide (PPS) resin, a polyether ether ketone (PEEK) resin, and a polybenzoxazole (PBO) resin.

(Aramid Resin)

In particular, it is preferable that the binder resin is an aramid resin (aromatic polyamide). When the aramid resin is used as the binder resin, an insulation sheet exhibiting further excellent mechanical strength is provided despite high packing ratio of the insulating particles. In the prior-art insulation sheets, as a result of large thickness of the sheet itself, thermal resistance value may become higher. In contrast, the insulation sheet using the aramid resin is excellent in mechanical strength despite high packing ratio of the insulating particles, in particular the boron nitride. Therefore, the insulation sheet using the aramid resin exhibits the reduced thickness of the sheet itself and the excellent low thermal resistance of the entire sheet. Further, from the viewpoint of thermal properties, it is preferable that the binder resin is the aramid resin. The aramid resin has a relatively high thermal decomposition temperature, and the insulation sheet using the aramid resin as the binder resin exhibits excellent flame retardancy.

The aramid resin is a linear polymer compound in which 60% or more of amide bonds are directly bonded to aromatic rings. As the aramid resin, for example, polymetaphenylene isophthalamide and a copolymer thereof, polyparaphenylene terephthalamide and a copolymer thereof can be used, and examples thereof include copolyparaphenylene•3,4'-diphenylether terephthalamide. The aramid resin may be used alone, or a plurality of aramid resins may be used as a mixture.

<Void>

The insulation sheet of the present disclosure contains, for the entire cross-section perpendicular to the in-plane direction of the sheet, 10% by area or less of voids, based on 100% by area of the total of the insulating particles, the binder resin, and the voids. When the voids are 10% by area or less, it is possible to obtain good thermal conductivity in the in-plane direction.

Preferably, for the entire cross-section perpendicular to the in-plane direction of the insulation sheet of the present disclosure, the sheet comprises 8% by area or less, 6% by area or less, 4% by area or less, 3% by area or less, 2% by area or less, or 1% by area or less of the voids, based on 100% by area of the total of the insulating particles, the binder resins, and the voids. Although the lower limit of the void is not particularly limited, for the entire cross-section perpendicular to the in-plane direction of the sheet, the voids may be 0.01% by area or more, 0.1% by area or more, 0.5% by area or more, 0.8% by area or more, or 1.0% by area or more, based on 100% by area of the insulating particles, the binder resin and the voids.

In the present disclosure, for the entire cross-section perpendicular to the in-plane direction of the sheet, the "% by area" of the voids based on 100% by area of the total of the insulating particles, the binder resin and the voids can be calculated by taking an image of the cross-section perpendicular to the in-plane direction of the insulation sheet by SEM, and measuring the area of the voids present in an area in the acquired image. Incidentally, in the case where the insulation sheet has additive(s) other than the insulating particles and the binder resin, the "% by area" of the voids based on 100% by area of the total of the insulating particles, the binder resin and the voids can be calculated by, for example, setting the above-mentioned area so that the additives are not included in the above-mentioned area.

In the present disclosure, "void" means a gap formed between the elements constituting the insulation sheet. Voids are formed, for example, when bubbles or the like are trapped between the insulating particles at the time of manufacturing the insulation sheet.

<Skin Layer>

The insulation sheet according to the present disclosure preferably has a skin layer. The skin layer is a layer constituting a surface layer of the insulation sheet, and contains a binder resin but does not contain insulating particles. When the insulation sheet has a skin layer, it is possible to prevent the exposure and escape of the insulating particles to the outside of the insulation sheet.

The thickness of the skin layer is preferably from 0.01 μm to 10 μm, and more preferably from 0.1 μm to 1 μm. When the thickness of the skin layer is 0.01 μm or more, the effect of retaining the insulating particles in the insulation sheet is further improved. When the thickness of the skin layer is 10 μm or less, it is possible to reduce the thermal resistance caused by the skin layer, resulting in further improvement of the thermal conductivity of the insulation sheet.

The thickness of the skin layer in the insulation sheet is calculated by observing a cross-section perpendicular to the in-plane direction of the insulation sheet by SEM and measuring the thickness of the surface layer of the insulation sheet at five locations of the cross-sectional SEM image, and by averaging the measured values.

<Surface Roughness>

The insulation sheet according to the present disclosure preferably has reduced exposure of the insulating particles in the insulation sheet surface, and has a surface structure with relatively high smoothness. Specifically, for the insulation sheet according to the present disclosure, it is preferable that the surface roughness Ra is 0.5 µm or less. When the surface roughness Ra of the insulation sheet is 0.5 µm or less, the interfacial thermal resistance between the insulation sheet and a heat source is suppressed, which makes it possible to further improve the thermal diffusivity. The surface roughness Ra is more preferably 0.4 µm or less, particularly preferably 0.2 µm or less, and most preferably 0.1 µm or less. Incidentally, the lower limit of the surface roughness is not particularly limited, but may be, for example, 0.01 µm or more.

The surface roughness Ra can be measured using a microfigure measuring instrument. Specifically, the range of 1 mm in the surface along the in-plane direction of the insulation sheet is scanned under the conditions of 0.2 µm interval, 50 µN stylus pressure, and 5 µm/s speed, and for each point measured, the difference between the measurement value of that point and an average value of measured values of points present within 40 µm from that point is calculated in order to determine the surface height, then the average value of the surface height of all the measured points are calculated, and this average value can be used as the surface roughness Ra.

<Residual Salt Concentration>

Preferably, the salt contained in the insulation sheet according to the present disclosure is reduced. Although the upper limit of the salt concentration contained in the insulation sheet varies depending on the application of the insulation sheet, the salt concentration is preferably 900 ppm or less; in particular, the chlorine concentration (chloride ion concentration) in the insulation sheet is preferably 900 ppm or less, or the concentration of the sum of bromine and chlorine in the insulation sheet is preferably 1500 ppm or less. When the chlorine concentration in the insulation sheet is 900 ppm or less, or the concentration of the total of bromine and chlorine in the insulation sheet is 1500 ppm or less, the insulation sheet can be used as the general halogen-free material. The chlorine concentration in the insulation sheet is more preferably 500 ppm or less, still more preferably 100 ppm or less, and particularly preferably 50 ppm or less. The lower limit of the chlorine concentration is not particularly limited, but may be, for example, 0.1 ppm or more, or 1 ppm or more. The salt concentration contained in the insulation sheet can be measured by an ion chromatography method.

<Residual Solvent Concentration>

The total amount of the residual solvent and water in the insulation sheet (residual solvent concentration) is preferably 3% by weight or less, based on the insulation sheet. When the total amount of the residual solvent and water contained in the insulation sheet is 3% by weight or less based on the insulation sheet, vaporization and/or condensation of the residual solvent and/or water are suppressed when the insulation sheet is mounted on an electronic device or the like, so that better operation of the electronic device can be ensured. The total amount of the residual solvent and water contained in the insulation sheet is preferably 2.5% by weight or less, more preferably 2.0% by weight or less, particularly preferably 1.5% by weight or less, and most preferably 1.0% by weight or less, based on the insulation sheet. The lower limit of the total amount of the residual solvent and water in the insulation sheet is not particularly limited, but may be, for example, 0.01% by weight or more, or 0.1% by weight or more. The residual solvent concentration of the insulation sheet can be measured by thermogravimetry-differential thermal analysis (TG-DTA)

<Thickness of Insulation Sheet>

The thickness of the insulation sheet is preferably 100 µm or less. Preferably, the thickness of the insulation sheet is 80 µm or less, 70 µm or less, 60 µm or less, or 50 µm or less. The lower limit of the thickness of the insulation sheet is not particularly limited, and may be, for example, 0.1 µm or more, 1 µm or more, or 10 µm or more. When the thickness of the insulation sheet is 100 µm or less, the thermal resistance value of the insulation sheet itself is reduced, which is preferable. Further, when the insulation sheet itself has the reduced thickness, it can exhibit the heat dissipation performance in a limited space inside an electronic device.

<Parts by Volume>

In another embodiment of the insulation sheet according to the present disclosure, the insulation sheet according to the present disclosure contains 75 to 97 parts by volume of insulating particles, 3 to 25 parts by volume of a binder resin, and 10 parts by volume or less of voids, based on 100 parts by volume of the insulation sheet.

Preferably, the insulating particles contained in the insulation sheet according to the present disclosure may be 80 parts by volume or more, 85 parts by volume or more, or 90 parts by volume or more, and/or 96 parts by volume or less, 95 parts by volume or less, 94 parts by volume or less, 93 parts by volume or less, 92 parts by volume or less, or 91 parts by volume or less, based on 100 parts by volume of the insulation sheet.

Preferably, the binder resin contained in the insulation sheet according to the present disclosure may be 5 parts by volume or more, 6 parts by volume or more, 7 parts by volume or more, or 8 parts by volume or more, and/or 24 parts by volume or less, 20 parts by volume or less, 15 parts by volume or less, 12 parts by volume or less, or 10 parts by volume or less, based on 100 parts by volume of the insulation sheet.

Preferably, the insulation sheet of the present disclosure contains 8 parts by volume or less, 6 parts by volume or less, 4 parts by volume or less, 3 parts by volume or less, 2 parts by volume or less, or 1 part by volume or less of voids, based on 100 parts by volume of the insulation sheet. The lower limit of the content of the voids is not particularly limited, but may be, for example, 0.01 parts by volume or more, 0.1 parts by volume or more, 0.5 parts by volume or more, 0.8 parts by volume or more, or 1.0 parts by volume or more.

When the insulation sheet has roughly uniform composition and thickness over the same sample plane, it is considered that the % by area of each component determined in a cross-section perpendicular to the in-plane direction is considered to be substantially equal to the volume ratio of each component in the insulation sheet (parts by volume relative to 100 parts by volume of the insulation sheet). Therefore, parts by volume of the voids in the insulation sheet can be calculated in the same manner as the method described above for the % by area of the voids.

<Additives>

The insulation sheet of the present invention may contain a flame retardant agent, an anti-discoloration agent, a surfactant, a coupling agent, a colorant, a viscosity modifier, and/or a reinforcing material. Further, in order to increase the strength of the sheet, the insulation sheet may contain a fibrous reinforcing material. Use of short fibers of an aramid resin as the fibrous reinforcing material is preferable because the heat resistance of the insulation sheet is not lowered by the addition of the reinforcing material. The fibrous reinforcing material is preferably added in a range of 0.5 to 25 parts by volume, and more preferably in a range of 1 to 20 parts by volume, based on 100 parts by volume of the insulation sheet. When the reinforcing material or the like is added, the percentage of the binder resin to 100 parts by volume of the insulation sheet is preferably 3 parts by volume or more.

<Use>

The insulation sheet according to the present disclosure can be used, for example, for the purpose of quickly diffusing the heat generated in a heat-generating component such as a semiconductor element or a power supply or a light source inside an electrical product, in order to mitigate the local temperature rise, or for the purpose of transporting the heat away from the heat source.

Specifically, examples of use of the insulation sheet according to the present disclosure include use in which the insulation sheet is attached to the side of a heat source (CPU, etc.) to diffuse the heat of the heat source, thereby reducing the temperature of the heat source (the chip), or, use in which the insulation sheet is attached to the side of a housing in order to reduce the local increase of the housing temperature.

When the insulation sheet is applied to an electronic device, a method of applying the insulation sheet is not particularly limited. For example, the insulation sheet may be arranged, directly in contact with, or via other thermal conductive body, on a heat source, such as a semiconductor within an electronic device, such that the surface temperature of the heat source can be efficiently reduced. Further, the insulation sheet can be arranged between a heat source and a low-heat-resistant electronic component, in order to diffuse the heat transferred to the low-heat-resistant electronic component, thereby protecting the electronic component from the heat. Further, the insulation sheet can be arranged between a heat source and a liquid crystal display, in order to reduce defects in the liquid crystal display due to local heating, such as color unevenness. Furthermore, the insulation sheet can be arranged between a heat source and an outer surface of an electronic device, in order to reduce the local temperature rise in the outer surface of the electronic device, thereby further improving user safety, such as the effect of avoiding low temperature burns.

<Adhesive Layer>

A viscous layer and/or an adhesive layer may be disposed on one or both surfaces of the insulation sheet. In this case, a known viscous layer and adhesive layer may be used. By arranging the viscous layer and/or adhesive layer on the surface(s) of the insulation sheet, installation of the insulation sheet to the interior of an electronic device or the like becomes more convenient.

<Thermal Conductivity and Dielectric Breakdown Voltage>

In one embodiment according to the present disclosure, the thermal conductivity of the insulation sheet is 30 W/(m·K) or more in the in-plane direction, and the dielectric breakdown voltage is 5 kV/mm or more.

(Thermal Conductivity in the In-Plane Direction)

When the thermal conductivity is 30 W/(m·K) or more in the in-plane direction, the heat of an electronic device can be diffused sufficiently, resulting in a reduction of occurrence of a heat spot, which is preferable. It is preferable that the thermal conductivity is as high as possible, but the thermal conductivity that can normally be achieved may be at most 100 W/(m·K) in the in-plane direction.

Preferably, the thermal conductivity of the insulation sheet is, in the in-plane direction, 35 W/(m·K) or more, 40 W/(m·K) or more, 45 W/(m·K) or more, 50 W/(m·K) or more, or 55 W/(m·K) or more.

Thermal conductivity in the in-plane direction of the insulation sheet can be calculated by multiplying a thermal diffusivity, a specific gravity, and a specific heat. In other words, it can be calculated as follows:

$$(\text{Thermal conductivity}) = (\text{Thermal diffusivity}) \times (\text{Specific heat}) \times (\text{Specific gravity}).$$

The above thermal diffusivity can be measured by an optical alternating current (AC) method, using an optical AC method thermal diffusivity measurement apparatus. The specific heat can be determined by a differential scanning calorimeter. Further, the specific gravity can be determined from the external dimensions and weight of the insulation sheet.

(Thermal Conductivity in the Thickness Direction)

In another embodiment of the insulation sheet according to the present disclosure, the thermal conductivity of the insulation sheet is 0.5 W/(m·K) or more and 5.0 W/(m·K) or less, in the thickness direction.

In particular, the thermal conductivity of the insulation sheet may be 0.8 W/(m·K) or more, or 1.0 W/(m·K) or more, and/or 4.5 W/(m·K) or less, or 4.0 W/(m·K) or less, in the thickness direction.

Thermal conductivity in the thickness direction of the insulation sheet can be calculated by multiplying a thermal diffusivity, a specific gravity and a specific heat. In other words, it can be calculated as follows:

$$(\text{Thermal conductivity}) = (\text{Thermal diffusivity}) \times (\text{Specific heat}) \times (\text{Specific gravity}).$$

Thermal diffusivity in the thickness direction can be obtained by a temperature wave analysis method (a measurement method based on phase-shift of temperature wave). The specific heat can be determined by a differential scanning calorimeter. Further, the specific gravity can be determined from the external dimensions and weight of the insulation sheet.

(Dielectric Breakdown Voltage)

Preferably, the dielectric breakdown voltage of the insulation sheet is 5 kV/mm or more, 8 kV/mm or more, or 10 kV/mm or more. When the dielectric breakdown voltage is 5 kV/mm or more, occurrence of dielectric breakdown reduces, and the failure of an electronic device can be avoided, which is preferable.

The dielectric breakdown voltage of the insulation sheet can be measured in accordance with the test standard ASTM D149. A dielectric strength test equipment may be used for the measurement.

<Relative Permittivity>

In an embodiment of the insulation sheet of the present disclosure, the relative permittivity at 1 GHz is 6 or less. When the relative permittivity at 1 GHz of the insulation sheet is 6 or less, interference of an electromagnetic wave can be avoided, which is preferable.

Preferably, the relative permittivity at 1 GHz is 5.5 or less, 5.3 or less, 5.0 or less, or 4.8 or less. The lower limit of the relative permittivity is not particularly limited, but may be, for example, 1.5 or more, or 2.0 or more.

The relative permittivity according to the present disclosure can be measured by a network analyzer using a specimen-hole closed type perturbation method of cavity resonance mode.

<<Manufacturing Method>>

The present disclosure includes a method for manufacturing the insulation sheet according to the present disclosure, the method comprising:

a mixing step of mixing insulating particles, a binder resin, and a solvent to obtain a slurry, a shaping step of shaping the slurry after the mixing into a sheet and drying the shaped slurry to form an insulation sheet precursor, and a roll-press step of subjecting the insulation sheet precursor to a roll press treatment.

<Mixing Step>

In the mixing step of the manufacturing method according to the present disclosure, insulating particles, a binder resin, and a solvent are mixed to obtain a slurry.

Regarding the insulating particles and the binder resin, reference can be made to the above descriptions relating to the insulation sheet.

In the mixing step, optionally, additives such as a flame retardant, an anti-discoloration agent, a surfactant, a coupling agent, a colorant, a viscosity modifier, and/or a reinforcing material may be added. In order to increase the strength of the sheet, a fibrous reinforcing material may be added.

In the mixing step, anhydrous calcium chloride or anhydrous lithium chloride may be added. When anhydrous calcium chloride or anhydrous lithium chloride is added in the mixing step, solubility of a binder resin to a solvent may be improved. In particular, when an aramid resin is used as the binder resin, anhydrous calcium chloride or anhydrous lithium chloride is preferably added in the mixing step, and in this case, it is possible to further improve the solubility of the aramid resin in the solvent.

(Solvent)

As the solvent, a solvent capable of dissolving the binder resin can be used. For example, when an aramid resin is used as the binder resin, 1-methyl-2-pyrrolidone (NMP), N,N-dimethylacetamide, or dimethyl sulfoxide can be used.

(Mixing)

For mixing the insulating particles, the binder resin, and the solvent, a general mixing apparatus, such as a paint shaker, a bead mill, a planetary mixer, a stirring type disperser, a rotation-revolution stirring mixer, a three-roll mill, a kneader, a single-shaft or two-shaft kneader, or the like, can be used.

<Shaping Step>

In the shaping step of the manufacturing method according to the present disclosure, the slurry after the mixing step is shaped into a sheet and dried to form an insulation sheet precursor.

(Shaping)

In order to shape the slurry after the mixing into a sheet, a known method, such as an extrusion molding, an injection molding, or a laminate molding, can be used, in addition to a method of applying a resin composition on a release film by a coater.

(Drying)

Drying may be carried out by a known method. For example, the slurry applied on a substrate may be dried, and then, after the shaped slurry is peeled from the substrate in water, a further drying may be performed. The drying temperature may be, for example, 50° C. to 120° C., and the drying time may be, for example, 10 minutes to 3 hours.

In the shaping step, a water washing treatment may be performed. By performing the water washing treatment, it is possible to reduce a residual solvent, and if present, a salt, in the insulation sheet. For example, the water washing treatment may be carried out, after drying the shaped slurry applied on the substrate, by immersing it in ion-exchanged water for 10 minutes to 3 hours. The water washing treatment may be performed on the insulation sheet precursor. When anhydrous calcium chloride or anhydrous lithium chloride is added in the mixing step, water washing treatment is preferably performed.

It is believed that a shaped slurry or insulation sheet precursor has more voids than an insulation sheet subjected to a roll press treatment, and therefore has higher permeability to water. Therefore, it is considered that the residual solvent and the salt can be more efficiently removed by performing the water washing treatment at a stage before performing the roll press treatment.

Incidentally, water contained in the insulation sheet can be reduced by drying or by performing a roll press treatment, after washing with water.

<Roll Press Step>

In the roll press step of the manufacturing method according to the present disclosure, the insulation sheet precursor is subjected to a roll press treatment.

As described above, by subjecting the insulation sheet precursor to a roll press treatment, it is possible to obtain an insulation sheet having excellent thermal conductivity in the in-plane direction.

Further, when the insulation sheet precursor is subjected to a roll press treatment, an insulation sheet having a skin layer can be obtained. Although it is not clear why the skin layer is formed by subjecting the insulation sheet precursor to the roll press treatment, it is considered that by performing the roll press treatment, the binder resin present between the insulating particles is pushed out to form a surface layer, and as a result, an insulation sheet having a skin layer is provided.

Further, when the insulation sheet precursor is subjected to a roll press treatment, an insulation sheet having a relatively smooth surface structure can be obtained. Without wishing to be bound by theory, it is considered that the skin layer formed by the roll press treatment suppresses the exposure of the insulating particles to the surface of the insulation sheet, and as a result, the smoothness of the insulation sheet surface is further improved.

(Roll Press)

The roll press treatment may be performed by a known method, and for example, the insulation sheet precursor may be pressed by a calender roll machine. The pressure applied to an insulation sheet precursor during the roll press treatment is preferably 400 to 8000 N/cm in linear pressure. When the linear pressure is 400 N/cm or more, the deformation of the insulating particles is promoted, and the discharge of air bubbles to the outside of the sheet becomes remarkable. When the linear pressure is 8000 N/cm or less, the insulating particles are sufficiently deformed and densely packed and voids inside the sheet are reduced while the breakage of the insulating particles is prevented. It is preferable that the diameter of a roll used in the roll press treatment is, for example, 200 mm to 1500 mm.

(Heating Temperature)

During the roll press treatment, it is preferable to heat the insulation sheet precursor. Suitable heating temperature can be determined depending on the type of the binder resin to be used, and the like. When an aramid resin is used as the binder resin, the heating temperature is preferably 100° C. to 400° C. By using the heating temperature of 100° C. or more, the binder resin is easily softened, and the effect of filling the gaps between the insulating particles by the roll press treatment is easily obtained. By using the heating temperature of 400° C. or less, the decrease in the strength of the binder resin due to the thermal history hardly occurs.

<Flat-Shaped Particle>

In an embodiment of the manufacturing method according to the present disclosure, the insulating particles contained in the slurry include flat-shaped particles. In this case, it is considered that the voids in the sheet are further reduced through the deformation of the particles by the roll press treatment. Without wishing to be bound by theory, it is considered that the flat-shaped particles may be susceptible to deformation as compared with, for example, spherical particles.

The insulating particles preferably contain 50% by volume or more of flat-shaped particles based on 100% by volume of the insulating particles, in particular 50% by volume or more of boron nitride based on 100% by volume of the insulating particles. The flat-shaped particles, particularly the boron nitride particles, are more preferably 60% by volume or more, more preferably 70% by volume or more, still more preferably 80% by volume or more, and particularly preferably 90% by volume or more, based on 100% by volume of the insulating particles.

In another embodiment of the manufacturing method according to the present disclosure, the insulating particles comprise flat-shaped particles and the slurry comprises 75 to 97 parts by volume of insulating particles and 3 to 25 parts by volume of a binder resin, based on 100 parts by volume of the total of the insulating particles and the binder resin. It is considered that when the insulation sheet precursor formed from such a slurry is subjected to a roll press treatment, the deformation of the flat-shaped particles is further promoted, and as a result, the voids of the insulation sheet are further reduced. Without wishing to be bound by theory, it is considered that when the content of the insulating particles in the insulation sheet precursor is relatively high, the shear stress exerted between the insulating particles during the roll press treatment is relatively high due to the relatively close distance between the insulating particles, and as a result, the deformation of the insulating particles is promoted. In addition, it is considered that the flat-shaped insulating particles deform so as to fill the gap in the sheet, and as a result, the percentage of the voids in the sheet is further reduced.

EXAMPLES

Hereinafter, the invention according to the present disclosure will be described in detail with reference to examples.

Examples 1-5, Comparative Examples 1-2, and Reference Example 1

Insulation sheets according to Examples 1 to 5, insulation sheets according to Comparative Examples 1 to 2, and an insulation sheet precursor according to Reference Example 1 were prepared. The properties of the obtained insulation sheets and insulation sheet precursor were measured. The measurements were performed as described below.

(1) Thermal Conductivity

Thermal conductivity of the insulation sheet was calculated by multiplying the thermal diffusivity, specific gravity and specific heat, for the thickness direction and the in-plane direction, respectively.

(Thermal conductivity)=(Thermal diffusivity)×(Specific heat)×(Specific gravity)

The thermal diffusivity in the thickness direction was determined by the temperature wave analysis method. Ai-Phase mobile M3 type1 manufactured by ai-Phase Co., Ltd was used as the measuring device. The thermal diffusivity in the in-plane direction was determined by the optical AC (optical alternating current) method, and LaserPIT manufactured by ADVANCE RIKO, Inc. was used as the measuring device. Specific heat was determined using a differential scanning calorimeter (DSCQ10 from TA Instruments). Specific gravity was determined from the outer dimensions and weight of the insulation sheet.

(2) Dielectric Breakdown Voltage

The dielectric breakdown voltage of the insulation sheet was measured in accordance with the test standard ASTM D149. The dielectric strength test equipment made by Tokyo Transformer Co. was used as the measurement equipment.

(3) Average Particle Size, Aspect Ratio (i) As an average particle size, a D50 value in the volume distribution is obtained by using a laser diffraction/scattering type particle size distribution measurement apparatus (MT3000, manufactured by MicrotracBEL Corp.), with measurement time of 10 seconds and with a single measurement.

(ii) The aspect ratio was calculated from the major axis and thickness of a particle measured at a magnification of 1500 times using a scanning electron microscope (TM3000 type Miniscope, manufactured by Hitachi High-Tech Corporation).

(4) Bulk Density

Bulk density was calculated for an insulation sheet cut to 50 mm square, from the mass measured using a precision electronic balance, the thickness measured by a micrometer, and the sheet area measured by a caliper.

(5) Percentage of Voids (% by Area)

Percentage of voids (porosity) was obtained by imaging a cross-section of a sheet perpendicular to the in-plane direction at a magnification of 3000 times with a scanning electron microscope (SEM), and by calculating the area of the voids in an area of the cross-sectional image obtained. When an insulation sheet contains a reinforcing material, the above-mentioned area was selected so that the reinforcing material was not included in the above-mentioned area.

(6) Degree of Orientation

The degree of orientation of the boron nitride was evaluated from peak intensity ratio of the transmission X-ray diffraction (XRD, NANO-Viewer manufactured by Rigaku Corporation) on a main surface of an insulation sheet as the measuring surface. The degree of orientation was defined by the following formula using (002) peak intensity I (002) corresponding to the c-axis (thickness) direction of the boron nitride crystal and the (100) peak intensity I (100) corresponding to the a-axis (plane).

(Orientation of Boron Nitride)=$I(002)/I(100)$

It is considered that the lower the value of the degree of orientation, the more the boron nitride is oriented in the same direction as the in-plane direction of a sheet.

(7) Relative Permittivity

The relative permittivity at 1 GHz of an insulation sheet was measured by a network analyzer (E8361A, manufactured by KEYCOM Corporation) in accordance with a specimen-hole closed type perturbation method of cavity resonance mode.

(8) Tensile Strength and Tensile Modulus

Tensile strength and tensile modulus were measured according to ISO527-1. The tester used was a TENSILON UCT-30T type manufactured by ORIENTEC CORPORATION.

(9) Surface Roughness

Surface roughness was measured using a microfigure measuring instrument ET200 made by Kosaka Laboratory Ltd. The range of 1 mm of the surface along the in-plane direction of an insulation sheet was scanned under the conditions of 0.2 μm interval, stylus pressure of 50 μN, and velocity of 5 μm/s. Then, for each point measured, the surface height was determined by calculating the difference between the measured value of that point and the average value of the measured values of nearby points existing within 40 μm from that point. Then, the average value of the surface height of all the measured points, which is the surface roughness Ra, was calculated.

(10) Thickness of Skin Layer

Thickness of the skin layer in an insulation sheet was obtained by imaging a cross-section perpendicular to the in-plane direction of the insulation sheet with SEM, measuring the thickness of the surface layer of the insulation sheet at five locations in the cross-sectional SEM image of the insulation sheet obtained, and by averaging the measured values.

(11) Residual Solvent Concentration

The residual concentration (residual solvent concentration) of water and solvent (NMP) contained in an insulation sheet was measured by a horizontal differential type TG-DTA (ThermoMass Photo, manufactured by Rigaku Corporation). Specifically, test pieces of about 1 mm square were produced by cutting a plurality of insulation sheets, and these test pieces (6.7 mg in total) were subjected to a temperature-raising treatment from room temperature to 500° C. at 10° C./minute under a helium atmosphere, in order to measure the percentage of the weight reduction. The percentage of weight loss measured was used as the residual solvent concentration.

(12) Residual Salt Concentration

The salt concentration (calcium chloride concentration) contained in an insulation sheet was measured by an ion chromatography method. Specifically, 100 mg of the insulation sheet was burned at 900° C. for 10 minutes under a flow of oxygen, and the generated gas was absorbed into 5 mL of pure water. Then, the chloride ion concentration in the pure water absorbing the gas was measured by Integrion manufactured by Thermo Fisher Scientifc., and this was used as the residual salt concentration.

Example 1

To 350 parts by volume of 1-methyl-2-pyrrolidone (manufactured by FUJIFILM Wako Pure Chemical Corporation), 5 parts by volume of aramid resin "Technora" (copolyparaphenylene•3,4'-diphenylether terephthalamide, manufactured by Teijin Limited) as a binder resin and 2 parts by volume of anhydrous calcium chloride (manufactured by FUJIFILM Wako Pure Chemical Corporation) as a stabilizer of a dissolved resin were dissolved, and then 95 parts by volume of scaly boron nitride particles "HSL" (manufactured by Dandong Chemical Engineering Institute Co., with mean particle diameter of 30 μm and aspect ratio of 38) as insulating particles were added, and the mixture was mixed for 10 minutes with a rotation-revolution mixer to obtain a slurry. The obtained slurry was applied onto a glass plate using a bar coater with a clearance of 0.14 mm for shaping, and dried at 115° C. for 20 minutes. Thereafter, after immersing and desalting in ion-exchanged water for 1 hours, the slurry shaped into a sheet was peeled from the glass plate in water. The peeled sheet was dried at 100° C. for 30 minutes to obtain an insulation sheet precursor having a thickness of 100 μm. The resulting insulation sheet precursor was subjected to a compression treatment by a calender roll machine under the conditions of 280° C. and linear pressure of 4000 N/cm, to obtain a flexible insulation sheet having a thickness of 37 μm (the insulation sheet according to Example 1).

Example 2

An insulation sheet having a thickness of 27 μm (the insulation sheet of Example 2) was obtained in the same manner as in Example 1, except that 8 parts by volume of aramid resin and 92 parts by volume of scaly boron nitride particles were used.

Example 3

To 450 parts by volume of 1-methyl-2-pyrrolidone (manufactured by Fujifilm Wako Pure Chemical Corporation), 10 parts by volume of an aramid resin "Technora" as a binder resin and 2 parts by volume of anhydrous calcium chloride (manufactured by Fujifilm Wako Pure Chemical Corporation) as a stabilizing agent of a dissolved resin were dissolved, and 90 parts by volume of scaly boron nitride particles "PT110" (manufactured by Momentive, with average particle diameter of 45 μm and aspect ratio of 35) as insulating particles were added, and the mixture was stirred for 60 minutes by a Three-One Motor stirrer while heating to 80° C., thereby obtaining a uniform slurry.

The obtained slurry was applied onto a glass plate using a bar coater with a clearance of 0.28 mm to form a sheet, and dried at 70° C. for 1 hours. Thereafter, the shaped slurry was peeled from the glass plate in water and then dried at 100° C. for 1 hours to obtain an insulation sheet precursor having a thickness of 100 μm. The resulting insulation sheet precursor was subjected to a compression treatment by a calender roll machine under the conditions of 270° C. and linear pressure of 4000 N/cm, to obtain an insulation sheet having a thickness of 48 μm (the insulation sheet according to Example 3).

Example 4

An insulation sheet having a thickness of 25 μm (the insulation sheet according to Example 4) was obtained in the same manner as in Example 1, except that 20 parts by volume of aramid resin and 80 parts by volume of scaly boron nitride particles were used.

Example 5

An insulation sheet having a thickness of 32 μm (insulation sheet according to Example 5) was obtained in the same manner as in Example 1, except that 4 parts by volume of aramid resin and 92 parts by volume of scaly boron nitride particles were used, and 4 parts by volume of Twaron short fiber which is an aramid fiber (fiber length of 0.25 mm, manufactured by Teijin Aramid B.V. Co.) was added as a fiber reinforcing material.

Comparative Example 1

An insulation sheet precursor having a thickness of 100 μm was prepared in the same manner as in Example 1, except that 8 parts by volume of aramid resin and 92 parts by volume of scaly boron nitride particles were used. The insulation sheet precursor was subjected to a hot press treatment using a vertical vacuum press apparatus at 280° C. in a vacuum atmosphere of 5 Pa under a load of 5 tons (20 MPa) for 2 minutes (after starting the press, 40 minutes for raising the temperature, 2 minutes for holding, and 70 minutes for decreasing the temperature), to obtain an insulation sheet having a thickness of 42 μm (the insulation sheet according to Comparative Example 1).

Comparative Example 2

An insulation sheet having a thickness of 26 μm (the insulation sheet according to Comparative Example 2) was obtained in the same manner as in Example 1, except that 30 parts by volume of aramid resin and 70 parts by volume of scaly boron nitride particles were used.

Reference Example 1

An insulation sheet precursor having a thickness of 100 μm (the insulation sheet precursor according to Reference Example 1) was obtained in the same manner as in Example 1 by drying at 100° C. for 30 minutes, except that 8 parts by volume of aramid resin and 92 parts by volume of scaly boron nitride particles were used.

<Evaluation of Properties>

The measurement results performed for Examples 1 to 5, Comparative Examples 1 to 2, and Reference Example 1 are shown in Table 1. Incidentally, regarding Reference Example 1, a cross-section perpendicular to the in-plane direction cannot be defined due to large voids, and therefore an evaluation in a cross-section cannot be performed. Therefore, % by area of insulating particles, a binder resin and voids for Reference Example 1 are denoted as "unable to be measured".

TABLE 1

| | | | | Unit | Ex. 1 | Ex. 2 | Ex. 3 | Ex. 4 | Ex. 5 | Comp. Ex. 1 | Comp. Ex. 2 | Ref. 1 |
|---|---|---|---|---|---|---|---|---|---|---|---|---|
| Composition | insulating particles | flat-shaped "PT110" | boron nitride | parts by volume | — | — | 90 | — | — | — | — | — |
| | | | boron nitride "HSL" | parts by volume | 95 | 92 | — | 80 | 92 | 92 | 70 | 92 |
| | binder resin | aramid resin "Technora" | | parts by volume | 5 | 8 | 10 | 20 | 4 | 8 | 30 | 8 |
| | reinforcing member | "Twaron" short fiber | | parts by volume | — | — | — | — | 4 | — | — | — |
| | | stabilizer | | parts by volume | 2 | 2 | 2 | 2 | 2 | 2 | 2 | 2 |
| | | solvent | | parts by volume | 350 | 350 | 450 | 350 | 350 | 350 | 350 | 350 |
| | manufacturing method (press) | | | — | roll press | roll press | roll press | roll press | roll press | vertical vacuum hot press | roll press | — |
| Characteristics | thermal conductivity (in plane direction) | | | W/m·K | 51 | 60 | 40 | 30 | 52 | 14 | 26 | 5 |
| | thermal conductivity (thickness direction) | | | W/m·K | 2.6 | 1.2 | 3.5 | 2.0 | 2.4 | 0.8 | 1.3 | 1.0 |
| | dielectric breakdown voltage | | | kV/mm | — | 60 | 75 | — | — | — | — | — |
| | bulk density | | | g/cm$^3$ | 2.03 | 2.02 | 2.11 | 2.04 | 1.93 | 1.50 | 1.88 | 0.60 |
| | insulating particles | | | % by area | (92.6) | (91.0) | (88.6) | (79.7) | (93.2) | (77.2) | (68.9) | (※) |
| | binder resin | | | % by area | (4.9) | (7.9) | (9.8) | (19.9) | (4.1) | (6.7) | (29.5) | (※) |
| | voids | | | % by area | 2.5 | 1.1 | 1.6 | 0.4 | 2.7 | 16.1 | 1.6 | (※) |
| | orientation | | | — | — | 0.74 | — | — | — | 0.40 | — | 0.91 |
| | relative permittivity (1 GHz) | | | — | — | 4.74 | — | — | — | — | — | — |
| | tensile strength | | | MPa | — | 1.38 | — | — | 3.47 | — | — | — |
| | tensile modulus of elasticity | | | GPa | — | 0.823 | — | — | 2.60 | — | — | — |
| | surface roughness | | | μm | — | 0.089 | — | — | — | 0.686 | — | — |
| | thickness of skin layer | | | μm | — | 0.1 | — | — | — | — | — | — |
| | residual concentration of solvent | | | % by weight | — | 0.7 | — | — | — | — | — | — |
| | residual concentration of salt | | | ppm | — | 35 | — | — | — | — | — | — |

(※): Unable to be measured

As can be seen in Table 1, relatively high thermal conductivity in the in-plane direction was observed in the insulation sheets according to Examples 1 to 5 which contains, for the entire cross-section perpendicular to the in-plane direction, 75 to 97% by area of insulating particles, 3 to 25% by area of binder resin, and 10% by area or less of voids. As described above, % by area of the binder resin and % by area of the insulating particles substantially correspond to parts by volume of the binder resin and parts by volume of the insulating particles, respectively, and in Table 1, "% by area" estimated in this manner is shown in "( )".

Incidentally, although the content of the insulating particles in Example 2 was lower than that in Example 1, Example 2 exhibited a particularly high thermal conductivity in the in-plane direction. One of the reasons why such a result was obtained may be that the percentage of the voids in Example 2 was reduced as compared with Example 1.

The insulation sheet of Comparative Example 1, which was subjected to the vacuum thermal press treatment instead of the roll-press treatment, contained 75 to 97% by area of the insulating particles and 3 to 25% by area of the binder resin, for the entire cross-section perpendicular to the in-plane direction. However, the insulation sheet of Comparative Example 1 had the percentage of voids of more than 10% by area, and exhibited relatively low thermal conductivity in the in-plane direction.

Further, the insulation sheet of Comparative Example 2, which contains less than 75% by area of the insulating particles and more than 25% by area of the binder resin, exhibited relatively low thermal conductivity in the in-plane direction.

<<SEM Observation>>

The insulation sheets of Examples 1 to 5, Comparative Examples 1 to 2, and Reference Example 1 were observed by a scanning electron microscope (SEM).

Figure 10:
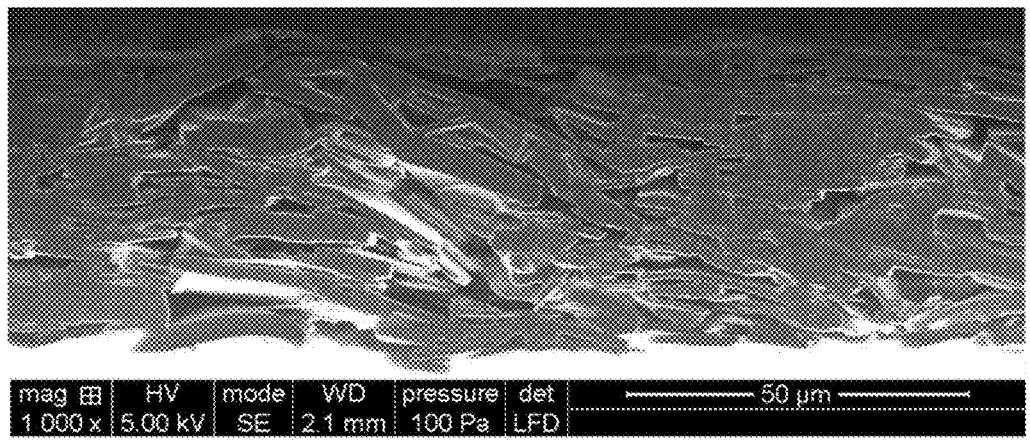
FIG. 10 shows a SEM photograph of a cross-section perpendicular to the in-plane direction of the insulation sheet according to Comparative Example 1.

FIG. 4 to FIG. 8 show SEM images of a cross-section perpendicular to the in-plane direction of the insulation sheets according to Examples 1 to 5, respectively. As seen in FIG. 4 to FIG. 8, in the insulation sheets of Examples 1 to 5, flat-shaped boron nitride particles were deformed so as to fill a gap in the sheet, and the voids were relatively small, for example as compared with Comparative Example 1 which was subjected to a vacuum hot press treatment (FIG. 10). Incidentally, in the SEM image of FIG. 8 according to Example 5, a twaron short fiber can be seen at the bottom section of the image.

Figure 9:
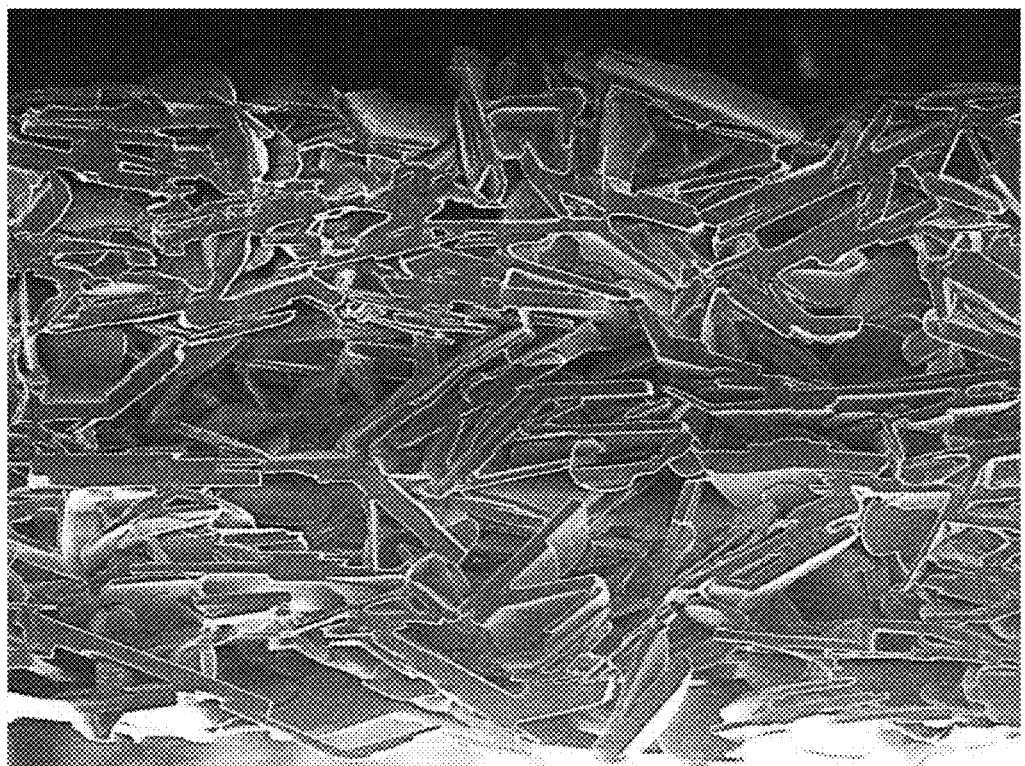
FIG. 9 shows a SEM photograph of a cross-section perpendicular to the in-plane direction of the insulation sheet precursor according to Reference Example 1.

FIG. 9 shows an SEM image of a cross-section perpendicular to the in-plane direction of the insulation sheet precursor according to Reference Example 1. As can be seen from FIG. 9, the sheet of Reference Example 1, which is an insulation sheet precursor not subjected to a pressure treatment, has relatively large voids and relatively low packing ratio of the insulating particles. Further, deformation of flat-shaped insulating particles was not observed.

Figure 11:
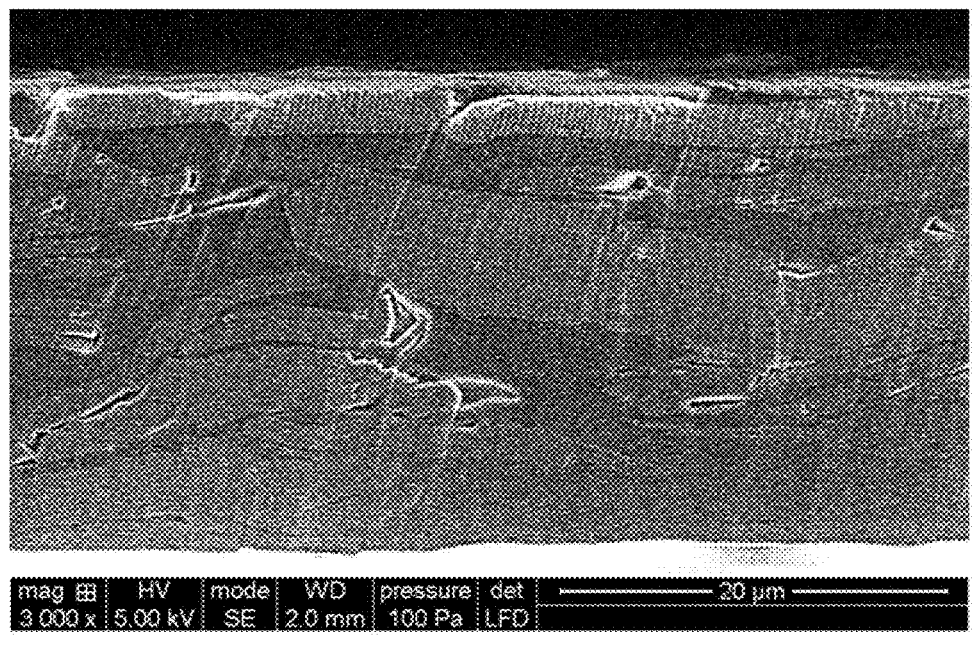
FIG. 11 shows a SEM photograph of a cross-section perpendicular to the in-plane direction of the insulation sheet according to Comparative Example 2.

FIG. 10 shows an SEM image of a cross-section perpendicular to the in-plane direction of the sheet according to Comparative Example 1. As seen in FIG. 10, in the sheet of Comparative Example 1 which was subjected to a vacuum vertical hot press instead of a roll press treatment during the pressure treatment, although the voids were reduced as compared with Reference Example 1 which was not subjected to a press treatment, relatively large amount of voids were remained in the sheet due to the three-dimensional hindrance of flat-shaped boron nitrides. Further, as can be seen in FIG. 10, in the insulation sheet of Comparative Example 2. As can be seen in FIG. 11, in the sheet of Comparative Example 2 which has less than 75% by area of the insulating particles and more than 25% by area of the binder resin, the distances between the insulating particles were relatively large due to the relatively large content of the binder resin.

Example 6 and Comparative Example 3

Next, surface-insulated metal silicon particles were used in addition to boron nitride as insulating particles, and an aramid resin "Conex" (polymetaphenylene isophthalamide; manufactured by Teijin Limited) was used as a binder resin. Insulation sheets according to Example 6 and Comparative Example 3 were prepared and physical properties thereof and the like were evaluated.

Example 6

An insulation sheet having a thickness of 56 μm (insulation sheet of Example 6) was prepared in the same manner as in Example 3, except that 20 parts by volume of aramid resin "Conex" as a binder resin was dissolved in 130 parts by volume of 1-methyl-2-pyrrolidone, and then, as insulating particles, 60 parts by volume of scaly boron nitride particles "PT110" and 20 parts by volume of metallic silicon particles "#350" (manufactured by KINSEI MATEC Co. LTD.; mean particle diameter of 15 μm; aspect ratio of 1), the surface of the metallic silicon particles being insulated by a thermal oxidizing method (at 900° C. for 1 hour in air), were added, and a bar coater having a clearance of 0.40 mm was used.

Comparative Example 3

In order to obtain an insulation sheet with a thickness of 50 μm (insulation sheet of Comparative Example 3), an insulation sheet was prepared in the same manner as in Example 3, except that 40 parts by volume of aramid resin "Technora" as a binder resin was dissolved in 520 parts by volume of 1-methyl-2-pyrrolidone, and then 60 parts by volume of boron nitride particles "PT110" as insulating particles were added, and a bar coater with a clearance of 0.80 mm was used.

The results of the measurements performed for Example 6 and Comparative Example 3 are shown in Table 2.

TABLE 2

|  |  |  |  | Unit | Ex. 6 | Comp. Ex. 3 |
|---|---|---|---|---|---|---|
| Composition | insulating particles | flat-shaped | boron nitride (PT110) | Parts by volume | 60 | 60 |
|  |  | spherical | Surface-insulated metal silicon particles | Parts by volume | 20 | — |
|  | binder resin |  | aramid resin "Technora" | Parts by volume | — | 40 |
|  |  |  | aramid resin "Conex" | Parts by volume | 20 | — |
|  |  |  | Solvent | Parts by volume | 130 | 520 |
|  | Manufacturing method (press) |  |  | — | roll press | roll press |
| Characteristics | thermal conductivity (in plane direction) |  |  | W/m · K | 24 | 8 |
|  | thermal conductivity (thickness direction) |  |  | W/m · K | 3.0 | 0.4 |
|  | dielectric breakdown voltage |  |  | kV/mm | 6.1 | — |
|  | bulk density |  |  | g/cm³ | 1.84 | 1.79 |
|  | insulating particles |  |  | % by area | (77.3) | (58.9) |
|  | binder resin |  |  | % by area | (19.3) | (39.3) |
|  | voids |  |  | % by area | 3.4 | 1.8 |

Example 1, although the flat-shaped insulating particles are deformed to some extent, the degree of deformation is not sufficient to fill the gap between the particles.

FIG. 11 shows an SEM image of a cross-section perpendicular to the in-plane direction of the sheet according to As can be seen from Table 2, in the insulation sheet of Example 6 containing 75 to 97% by area of insulating particles, 3 to 25% by area of a binder resin, and 10% by area or less of voids for the entire cross-section perpendicular to the plane direction, a relatively high thermal conductivity in the in-plane direction was observed, as compared with the insulation sheet of Comparative Example 3 in which the insulating particles were less than 75% by area and the binder resin was more than 25% by area. Since the insulation sheet of Example 6 contains metal silicon particles in addition to the boron nitride particles, it exhibits higher thermal conductivity in the thickness direction than Example 4.

INDUSTRIAL APPLICABILITY

The insulation sheet of the present invention can be suitably used as an insulating heat radiation member for a heat generating member in an electronic or electrical equipment, for example, as an insulating heat radiation member for dissipating heat of a semiconductor to a coolant or housing.

The insulation sheet of the present disclosure can efficiently diffuse and transport heat in the in-plane direction, and exhibits excellent insulating properties. Further, the insulation sheet of the present disclosure, even if broken, since there is no risk of causing an electrical short in the circuit, it can be suitably used for applications such as elimination of a heat spot in an electrical or electronic equipment, heat equalization, and heat dissipation.

REFERENCE SIGNS 10, 20, 30 insulation sheet
11, 21, 31 insulating particle
12, 22, 32 binder resin
13, 23, 33 void

The invention claimed is:

1. An insulation sheet comprising insulating particles and a binder resin,
    wherein, for the entire cross-section of the sheet perpendicular to the in-plane direction, based on 100% by area of the total of the insulating particles, the binder resin and voids, the insulation sheet contains 75 to 97% by area of the insulating particles, 3 to 25% by area of the binder resin, and 10% by area or less of the voids,
    wherein the insulating particles comprise flat-shaped particles that are deformed.

2. The insulation sheet according to claim 1, wherein the insulating particles include 50% by volume or more of boron nitride.

3. The insulation sheet according to claim 1, wherein a melting point or a thermal decomposition temperature of the binder resin is 150° C. or higher.

4. The insulation sheet according to claim 1, wherein the binder resin is an aramid resin.

5. The insulation sheet according to claim 1, which comprises a skin layer containing a binder resin and no insulating particles.

6. The insulation sheet according to claim 1, having a surface roughness Ra of 0.5 µm or less.

7. The insulation sheet according to claim 1, wherein a salt concentration is 900 ppm or less.

8. The insulation sheet according to claim 1, wherein a residual solvent concentration is 3% by weight or less.

9. The insulation sheet according to claim 1, having a thermal conductivity in the in-plane direction of 30 W/(m·K) or more, and a dielectric breakdown voltage of 5 kV/mm or more.

10. The insulation sheet according to claim 1, having a relative permittivity at 1 GHz of 6 or less.

11. A method for manufacturing the insulation sheet according to claim 1, comprising:
    mixing insulating particles, a binder resin, and a solvent to obtain a slurry,
    shaping the slurry after the mixing into a sheet and drying the shaped slurry to form an insulation sheet precursor, and
    subjecting the insulation sheet precursor to a roll press treatment.

12. The method according to claim 11, wherein the insulating particles comprise flat-shaped particles.

13. The method according to claim 12, wherein the insulating particles comprise 50% by volume or more of boron nitride.

14. The method according to claim 11, wherein the slurry comprises 75 to 97 parts by volume of the insulating particles and 3 to 25 parts by volume of the binder resin, based on 100 parts by volume of the total of the insulating particles and the binder resin.

* * * * *